United States Patent [19]

Nam

[11] Patent Number: 5,386,309
[45] Date of Patent: Jan. 31, 1995

[54] LIQUID CRYSTAL DISPLAY MODULE WITH POSITIONING MARKS ON CIRCUIT SUBSTRATE AND HEAT SEAL

[75] Inventor: Geung W. Nam, Kyungsangbook-Do, Rep. of Korea

[73] Assignee: Goldstar Co., Ltd., Seoul, Rep. of Korea

[21] Appl. No.: 808,930

[22] Filed: Dec. 18, 1991

[30] Foreign Application Priority Data

Dec. 20, 1990 [KR]  Rep. of Korea ............... 20302/1990

[51] Int. Cl.6 ............................................. G02F 1/1343
[52] U.S. Cl. ...................................... 359/88; 359/80; 359/87
[58] Field of Search ............................. 359/88, 87, 80

[56] References Cited

U.S. PATENT DOCUMENTS

| 4,721,365 | 1/1988 | Nishimura | 359/88 |
| 4,772,100 | 9/1988 | Suenaga | 359/88 |

FOREIGN PATENT DOCUMENTS

| 0185016 | 11/1982 | Japan | 359/87 |
| 60-169834 | 9/1985 | Japan | . |
| 0237431 | 11/1985 | Japan | 359/88 |
| 0215526 | 9/1986 | Japan | 359/87 |
| 0260224 | 11/1986 | Japan | 359/87 |
| 63-250626 | 10/1988 | Japan | . |
| 63-324727 | 10/1988 | Japan | . |
| 0215824 | 9/1991 | Japan | 359/87 |

*Primary Examiner*—Anita Pellman Gross

[57] ABSTRACT

A liquid crystal display module includes a circuit substrate having at least two II-shaped positioning marks and a pattern line connected with the positioning marks in series, a heat seal having H-shaped positioning marks formed at locations corresponding to the locations of the II-shaped positioning marks and a liquid crystal display unit so that when the circuit substrate is aligned with the heat seal, the lamp connected with both ends of the pattern line is lighted for thereby allowing the aligned state of the circuit substrate and heat seal to be indicated. Therefore, the liquid crystal display module not only reduces the time required for the bonding process and the occurrence ratio of inferior products but also the reliance of products is increased.

7 Claims, 4 Drawing Sheets

LIQUID CRYSTAL DISPLAY MODULE WITH POSITIONING MARKS ON CIRCUIT SUBSTRATE AND HEAT SEAL

BACKGROUND OF THE INVENTION

1. Field of the Invention

The present invention relates to a liquid crystal display module, and more particularly to a liquid crystal display module which is capable of indicating, in cooperation with an indicating unit to be connected to the module, whether signal terminals of a heat seal are precisely aligned with signal terminals of a circuit substrate or not, prior to a heating press treatment in a bonding process of the module, and thereby allowing the module to be precisely bonded and reducing the time for the bonding process of the module.

2. Description of the Related Art

A conventional liquid crystal display module generally includes, as illustrated in FIG. 1, a circuit substrate 10 which is provided with a circuit pattern having signal terminals adapted to receive a liquid crystal drive signal outputted from an external device, a liquid crystal display unit 30 which is fixedly mounted on the circuit substrate 10 and adapted to achieve a display according to the liquid crystal drive signal, and a heat seal 20 for connecting the signal terminals of the circuit substrate 10 to the signal terminals of the liquid crystal display unit 30, respectively.

As shown in FIG. 2, the circuit substrate 10 is provided at its upper surface (the right side surface in the drawing) with a plurality (for example, four) of cross-shaped positioning marks 11 and with a plurality of signal terminals 12 that are provided by a circuit pattern made of a conductive material. Similarly, the heat seal 20 is provided at its upper surface with a plurality of cross-shaped positioning marks 21 and with a plurality of signal terminals 22 that are provided by a circuit pattern made of a conductive material. Also, the liquid crystal display unit 30 is provided at its upper surface with a plurality of cross-shaped positioning marks 31 and with a plurality of signal terminals 32 that are provided by a circuit pattern made of a conductive material. Cross-shaped positioning marks 11, 21 and 31 of the circuit substrate 10, the heat seal 20 and the liquid crystal display unit 30 correspond to one another, respectively, and are adapted to be aligned with one another for precisely aligning the circuit substrate 10, the heat seal 20 and the liquid crystal display unit 30 with one another when bonding them together. Also, signal terminals 12, 22 and 32 of the circuit substrate 10, the heat seal 20 and the liquid crystal display unit 30 correspond to one another, respectively.

In particular, the heat seal 20 includes a resin substrate 25 having a pattern which provides the cross-shaped positioning marks 21 and the signal terminals 22, as shown in FIG. 4. The cross-shaped positioning marks 21 and the signal terminals 22 are covered with an anisotropy conductive material 24. An insulation material layer 23 is deposited on the anisotropy conductive material layer 24.

In bonding, the worker aligns manually the circuit substrate 10, the heat seat 20 and the liquid crystal display unit 30 with one another while determining by a magnifying glass whether corresponding positioning marks 11, 21 and 31 of the circuit substrate 10, the heat seal 20 and the liquid crystal display unit 30 are precisely aligned with one another. Under this condition, the relative positions of the circuit substrate 10, the heat seal 20 and the liquid crystal display unit 30 are fixed by using a soldering iron. Thereafter, the circuit substrate 10, the heat seal 20 and the liquid crystal display unit 30, which are firmly maintained in their precise relative positions, are heat pressed by a heat pressing machine so that the liquid crystal display unit 30 is bonded to the circuit substrate 10, via the heat seal 20, to form a liquid crystal display module.

However, the determination for the alignment of positioning marks by the use of a magnifying glass and the manual fixing by the use of a soldering iron, which are required in bonding the above-mentioned construction of the conventional liquid crystal display module, is an unscientific and troublesome method. As a result, the alignment of positioning marks may be frequently incorrect, and thereby the rate of poor products increases. This also leads to the waste of materials. Furthermore, the productivity is reduced since the procedure for aligning the positioning marks is manually carried out by the determination through a magnifying glass.

SUMMARY OF THE INVENTION

Therefore, an object of the invention is to provide a liquid crystal display module which is capable of indicating whether signal terminals of a heat seal are precisely aligned with signal terminals of a circuit substrate in a bonding process of the heat seal and the circuit substrate so that the bonding process is carried out easily and accurately.

In order to achieve the above object, according to the present invention, there is provided a liquid crystal display module comprising: a circuit substrate provided with a first signal pattern of electrodes adapted to receive an external liquid crystal drive signal; a liquid crystal display unit fixedly mounted on the circuit substrate and adapted to display the information corresponding to the external liquid crystal drive signal; a heat seal provided with a second signal pattern of electrodes adapted to connect the signal pattern of the circuit substrate with the liquid crystal display unit; and an indicating unit adapted to indicate when the heat seal has been properly aligned with the circuit substrate.

In accordance with the present invention, the indicating unit adapted to indicate the alignment of the heat seal with the circuit substrate comprises: first positioning marks provided on the circuit substrate; second positioning marks provided on the heat seat and adapted to be overlapped with the first positioning marks when the heat seal aligns with the circuit substrate, a conductive pattern formed on the circuit substrate and adapted to connect the first positioning marks in series, the conductive pattern having output terminals at both ends, respectively; and a pair of external output terminals formed on the circuit substrate and adapted to connect the output terminals of the conductive pattern to an external display unit, so that the first positioning marks and the external display unit form a closed circuit when said first and second positioning marks overlap and contact for displaying that the heat seal has been properly aligned with the circuit substrate.

BRIEF DESCRIPTION OF THE DRAWINGS

These and other objects, features and advantages of the present invention will become more apparent upon a reading of the following detailed specification and drawings, in which.

DESCRIPTION OF THE PREFERRED EMBODIMENTS

Figure 1:
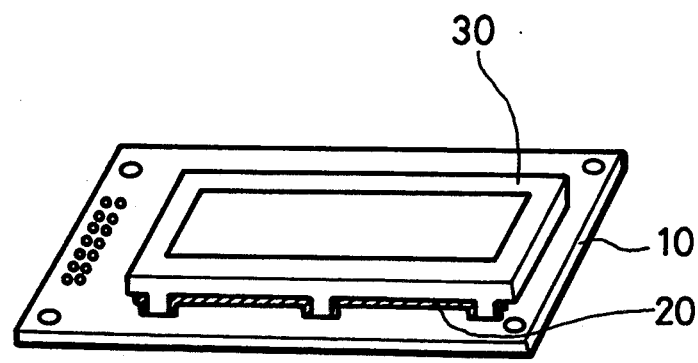
FIG. 1 is a perspective view of a liquid crystal display module according to prior art.
Figure 2:
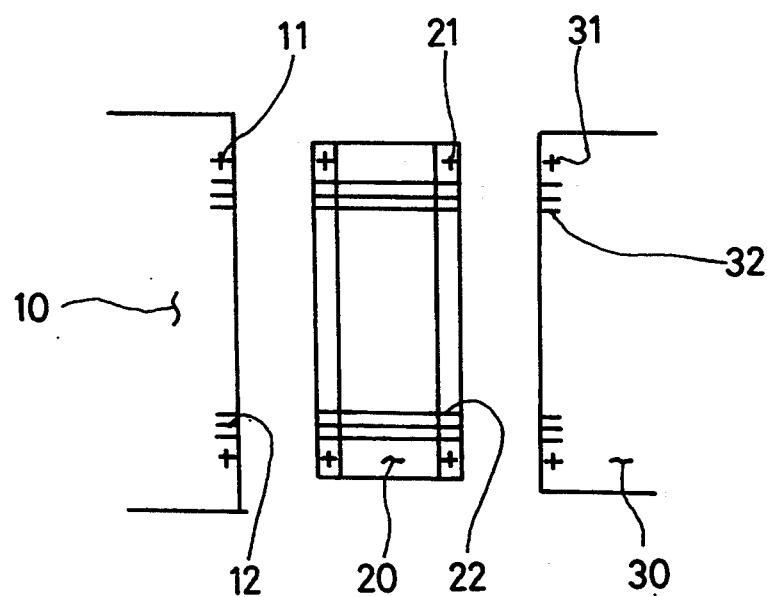
FIG. 2 is an exploded cross sectional view of FIG. 1, in which the liquid crystal display module is clockwise rotated at 90°.
Figure 3:
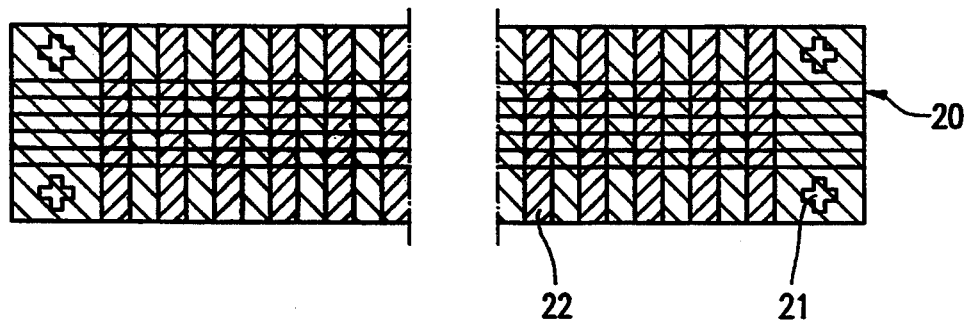
FIG. 3 is a plane view of a heat seal of the liquid crystal display module according to prior art.
Figure 4:
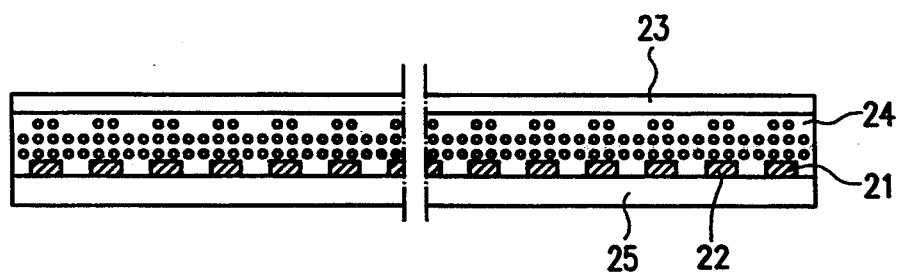
FIG. 4 is a vertical cross sectional view of a liquid crystal display module according to prior art.

The embodiments of the present invention will now be described by referring to FIGS. 5 to 8 in the accompanying drawings. Because a structure of elements of a liquid crystal display module according to the embodiments of the present invention except for positioning marks and the related elements are substantially equal to those of the conventional liquid crystal display module, the substantially identical or similar elements to those of the conventional liquid crystal display module illustrated in FIGS. 1 to 4 are designated by the similar reference characters.

Figure 5:
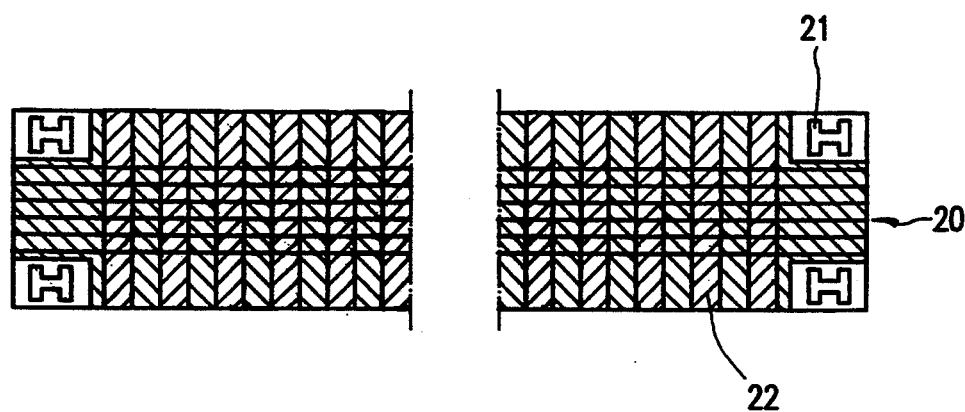
FIG. 5 is a plane view of a heat seal of the liquid crystal display module according to an embodiment of the present invention.
Figure 6:
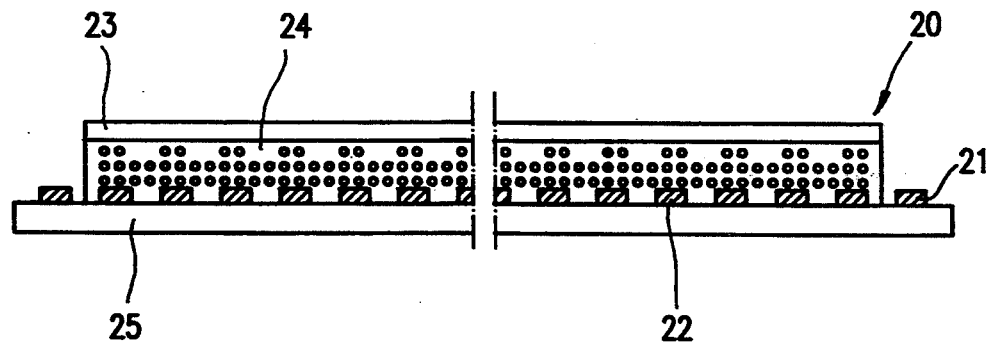
FIG. 6 is a vertical cross sectional view of a liquid crystal display module according to an embodiment of the present invention.
Figure 7:
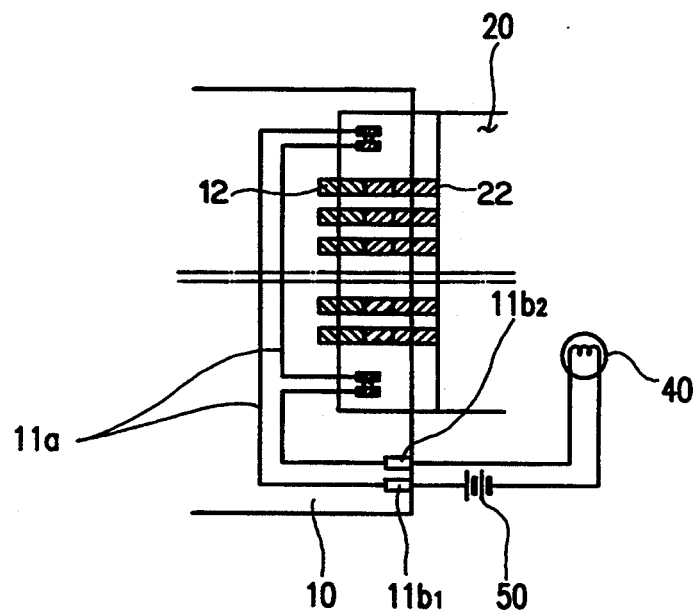
FIG. 7 is a schematic view showing an aligned state of a circuit substrate and a heat seal according to an embodiment of the present invention.

Referring to FIGS. 5 and 6, a heat seal 20 of a liquid crystal display module according to an embodiment of the present invention is shown.

The heat seal 20 of the liquid crystal display module in accordance with the present embodiment includes a resin substrate 25 on which a plurality of H-shaped positioning marks 21 and a plurality of signal terminals 22 are formed by a patterning process an anisotropy conductive material 24 applied on the signal terminals 22 and the H-shaped positioning marks 21 and an insulating material 23 deposited on the anisotropy conductive material 24. Particularly, the H-shaped positioning marks 21 are made of conductive material and are formed at four corners of the lower surface of the resin substrate 25, respectively, so as to be exposed outwardly.

In addition, the circuit substrate 10 in accordance with an embodiment of the present invention is provided with a plurality of conductive an embodiment positioning marks 11 an having II-shape and a plurality of signal terminals 12, as illustrated in FIGS. 1 and 5. The positioning marks 11 correspond to the positioning marks 21 of the heat seal 20, respectively. Also, the signal terminals 12 correspond to the signal terminals 22 of the heat seal 20, respectively. When the heat seal 20 is aligned with the circuit substrate 10, each II-shaped positioning mark 11 is overlapped with and contacts each corresponding H-shaped positioning mark 21 such that both I-shaped mark portions of the II-shaped positioning mark 11 are connected with each other. Also, the circuit substrate 10 is provided with a conductive pattern line 11a and an output connector having output terminals $11b_1$ and $11b_2$. The output terminals $11b_1$ and $11b_2$ are connected with an outside power source 50 and a lamp 40 in series. The conductive pattern line 11a is connected with the II-shaped positioning marks 11 and the output terminals $11b_1$ and $11b_2$ in series such that the II-shaped positioning marks 11, the lamp 40 and the power source 50 constitute a closed circuit when the II-shaped positioning marks 11 are overlapped with and contact the H-shaped positioning marks 21, respectively. Accordingly, if the circuit substrate 10 is aligned and contacted with the heat seal 20, the lamp 40 is lighted.

The bonding process of the above-mentioned construction of liquid crystal display module in accordance with the present embodiment will be described hereinafter.

First, the circuit substrate 10 is aligned with the heat seal 20 so that each signal terminal 12 of the substrate 10 is overlapped with each corresponding signal terminal 22 of the heat seal 20. Output terminals $11b_1$ and $11b_2$ of the circuit substrate 10 are then connected with the power source 50 and the lamp 40 in series. At this time, if a precise alignment of the circuit substrate 10 and the heat seal 20 is obtained, it is natural that the lamp 40 is lighted. Thereafter, the subsequent steps of the bonding process may be carried out.

Figure 8:
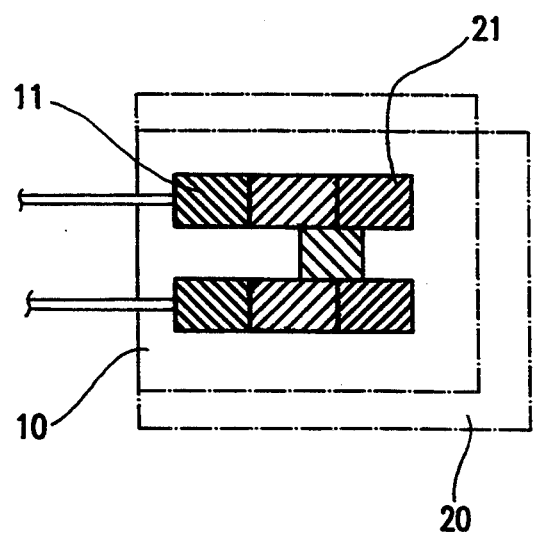
FIG. 8 is a schematic view showing an aligned state of a positioning mark of the circuit substrate and a positioning mark of the heat seal according to an embodiment of the present invention.

That is, when the circuit substrate 10 is aligned with the heat seal 20 such that each signal terminal 12 of the circuit substrate 10 is overlapped with each corresponding signal terminal 22 of the heat seal 20, each II-shaped positioning mark 11 of the circuit substrate 10 is overlapped with each corresponding H-shaped positioning mark 21 of the heat seal 20, as illustrated in FIG. 8, so that both I-shaped mark portions of each II-shaped positioning mark 11 are connected with each other by each corresponding H-shaped positioning mark 21, for thereby causing the II-shaped positioning marks 11 to be electrically switched on.

When the II-shaped positioning marks 11 are at their switched-on state, II-shaped and H-shaped positioning marks 11 and 21, the conductive pattern line 11a, the output connector having output terminals $11b_1$ and $11b_2$, the electrical power source 50 and the lamp 40 constitute an electrical closed circuit, for thereby causing the lamp 40 to be lighted.

Under the condition that the lamp 40 is lighted, the heat seal 20 is fixed to the circuit substrate 10 by appropriate means such as a soldering iron. Thereafter, the resulting fixed assembly is separated from the power source 50 and the lamp 40 and then subjected to a bonding treatment using a heat pressing.

As described above, the liquid crystal display module in accordance with the present embodiment is constructed such that its circuit substrate is provided with II-shaped positioning marks and a conductive pattern line connected with the II-shaped positioning marks and its heat seal is provided with H-shaped positioning marks. Thus, when the substrate is aligned with the heat seal in the bonding process, the lamp connected with the conductive pattern line is lighted, for thereby allowing a worker to easily determine the aligned state of the substrate and the heat seal. Therefore, the embodiment of the present invention not only reduce the time required for the bonding process and the rate of poor products, but also increase the reliance of products.

Changes in construction will occur to those skilled in the art and various different modifications and embodiments may be made without departing from the scope of the invention. The matter set forth in the foregoing description and accompanying drawings is offered by way of illustration only. It is therefore intended that the foregoing description be regarded as illustrative rather than limiting.

What is claimed is:

1. A liquid crystal display module comprising:

a circuit substrate provided with a first signal pattern of electrodes adapted to receive an external liquid crystal drive signal;

a liquid crystal display unit fixedly mounted on the circuit substrate and adapted to display the information corresponding to the external liquid crystal drive signal;

a heat seal provided with a second signal pattern of electrodes adapted to connect the first signal pattern of electrodes of the circuit substrate with the liquid crystal display unit; and alignment indicating means for indicating when the heat seal has been properly aligned with the circuit substrate in response to the first signal pattern of electrodes corresponding to the second signal pattern of electrodes, wherein said alignment indicating means comprises, first positioning marks provided on the circuit substrate, second positioning marks provided on the heat seal and adapted to be overlapped with the first positioning marks when the heat seal aligns with the circuit substrate, wherein each of the first positioning marks on the circuit substrate has an II-shape conductive structure which is electrically shorted when each of the first positioning marks is overlapped with the corresponding second positioning mark on the heat seal, a conductive pattern formed on the circuit substrate and adapted to connect the first positioning marks in series, the conductive pattern having output terminals at both ends, respectively, and a pair of external output terminals formed on the circuit substrate and adapted to connect the output terminals of the conductive pattern to external display means so that the first positioning marks and said external display means form a closed circuit when said first and second positioning marks overlap and contact for displaying that the heat seal has been properly aligned with the circuit substrate.

2. A liquid crystal display module according to claim 1, wherein the external display means comprises a DC power source and a lamp which are connected between the external output terminals in series, so that the first positioning marks, the DC power source and the lamp form a closed circuit for displaying the proper alignment of the circuit substrate and the heat seal.

3. A liquid crystal display module according to claim 1, wherein the heat seal comprises a substrate on which the second signal pattern of electrodes providing a plurality of signal terminals and the second positioning marks are formed, an anisotropy conductive layer covering the signal terminals, and an insulation layer applied on the anisotropy conductive layer, for thereby forming a construction with the second positioning marks being exposed outwardly.

4. A method for aligning a liquid crystal display module, comprising the steps of:

(a) patterning a plurality of first signal electrodes on a circuit substrate which receives an external liquid crystal drive signal;

(b) fixedly mounting a liquid crystal display unit on said circuit substrate which displays the information corresponding to said external liquid crystal drive signal;

(c) patterning a plurality of second signal electrodes on a heat seal which are used for connecting said first signal electrodes of said circuit substrate with said liquid crystal display unit; and (d) indicating when said heat seal has been properly aligned with said circuit substrate, wherein said step (d) further includes the steps of, (d)(1) patterning first positioning marks on said circuit substrate to have an II-shape conductive structure, (d)(2) patterning second positioning marks on said heat seal which overlap with said first positioning marks when said heat seal aligns with said circuit substrate, said II-shape conductive structure providing an electrical short when each of said first positioning marks overlaps with the corresponding second positioning mark on said heat seal, (d)(3) connecting said first positioning marks in series with a conductive pattern formed on said circuit substrate having output terminals at both ends respectively, (d)(4) connecting said output terminals of said conductive pattern to external display means, and (d)(5) forming a closed circuit with said first positioning marks and said external display means when said first and second positioning marks overlap and contact so that said external display means displays that said heat seal has been properly aligned to said circuit substrate.

5. A method for aligning a liquid crystal display module according to claim 4, further comprising the steps of:

forming said second signal pattern of electrodes providing a plurality of signal terminals and said second positioning marks on a substrate of said heat seal;

covering said signal terminals with an anisotropy conductive layer, and disposing an insulation layer on said anisotropy conductive layer so that said second positioning marks are formed to be outwardly exposed.

6. A liquid crystal display module comprising:

a circuit substrate provided with a first signal pattern of electrodes adapted to receive an external liquid crystal drive signal;

a liquid crystal display unit fixedly mounted on the circuit substrate and adapted to display the information corresponding to the external liquid crystal drive signal;

a heat seal provided with a second signal pattern of electrodes adapted to connect the first signal pattern of electrodes of the circuit substrate with the liquid crystal display unit; and alignment indicating means for indicating when the heat seal has been properly aligned with the circuit substrate in response to the first signal pattern of electrodes corresponding to the second signal pattern of electrodes, wherein said alignment indicating means comprises, first positioning marks provided on the circuit substrate, second positioning marks provided on the heat seal and adapted to be overlapped with the first positioning marks when the heat seal aligns with the circuit substrate, wherein each of the second positioning marks on the heat seal has an H-shape structure which functions to provide an electrical short between a corresponding one of the first positioning marks on the circuit substrate when the second positioning mark overlaps the corresponding first positioning mark, a conductive pattern formed on the circuit substrate and adapted to connect the first positioning marks in series, the conductive pattern having output terminals at both ends, respectively, and a pair of external output terminals formed on the circuit substrate and adapted to connect the output terminals of the conductive pattern to external display means so that the first positioning marks and said external display means form a closed circuit when said first and second positioning marks overlap and contact for displaying that the heat seal has been properly aligned with the circuit substrate.

7. A method for aligning a liquid crystal display module, comprising the steps of:
(a) patterning a plurality of first signal electrodes on a circuit substrate which receives an external liquid crystal drive signal;
(b) fixedly mounting a liquid crystal display unit on said circuit substrate which displays the information corresponding to said external liquid crystal drive signal;
(c) patterning a plurality of second signal electrodes on a heat seal which are used for connecting said first signal electrodes of said circuit substrate with said liquid crystal display unit; and
(d) indicating when said heat seal has been properly aligned with said circuit substrate, wherein said step (d) further includes the steps of,
  (d)(1) patterning first positioning marks on said circuit substrate,
  (d)(2) patterning second positioning marks on said heat seal to have an H-shape structure which overlaps with said first positioning marks when said heat seal aligns with said circuit substrate, said H-shape structure providing an electrical short with a corresponding one of said first positioning marks on the circuit substrate when the second positioning mark overlaps the corresponding first positioning mark,
  (d)(3) connecting said first positioning marks in series with a conductive pattern formed on said circuit substrate having output terminals at both ends respectively,
  (d)(4) connecting said output terminals of said conductive pattern to external display means, and
  (d)(5) forming a closed circuit with said first positioning marks and said external display means when said first and second positioning marks overlap and contact so that said external display means displays that said heat seal has been properly aligned to said circuit substrate.

* * * * *